(12) United States Patent
Farrah et al.

(10) Patent No.: US 10,246,986 B2
(45) Date of Patent: Apr. 2, 2019

(54) MAGNETOMETER MOUNTING FOR ISOLATION AND INTERFERENCE REDUCTION

(71) Applicant: Halliburton Energy Services, Inc., Houston, TX (US)

(72) Inventors: John Harrison Farrah, Houston, TX (US); Anand Prakash, Tomball, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 7 days.

(21) Appl. No.: 15/324,212

(22) PCT Filed: Apr. 30, 2015

(86) PCT No.: PCT/US2015/028495
§ 371 (c)(1),
(2) Date: Jan. 5, 2017

(87) PCT Pub. No.: WO2016/022185
PCT Pub. Date: Feb. 11, 2016

(65) Prior Publication Data
US 2017/0198564 A1    Jul. 13, 2017

Related U.S. Application Data

(60) Provisional application No. 62/035,009, filed on Aug. 8, 2014.

(51) Int. Cl.
*G01R 1/00* (2006.01)
*E21B 47/01* (2012.01)
(Continued)

(52) U.S. Cl.
CPC ............... *E21B 47/01* (2013.01); *G01V 3/26* (2013.01); *E21B 1/00* (2013.01); *E21B 10/00* (2013.01);
(Continued)

(58) Field of Classification Search
CPC ............ E21B 1/00; E21B 10/00; E21B 15/00; G01V 1/00; H04L 1/00
See application file for complete search history.

(56) References Cited

U.S. PATENT DOCUMENTS

2009/0179648 A1    7/2009  Fredette et al.
2010/0089574 A1*   4/2010  Wideman ............... E21B 7/14
                                                       166/272.1
(Continued)

FOREIGN PATENT DOCUMENTS

CA      2831496 A1    1/2009
WO   2013109278 A1    7/2013
WO   2016022185 A1    2/2016

OTHER PUBLICATIONS

"International Application Serial No. PCT/US2015/028495, International Search Report dated Aug. 20, 2015", 3 pgs.
(Continued)

*Primary Examiner* — Jermele M Hollington
*Assistant Examiner* — Temilade S Rhodes-Vivour
(74) *Attorney, Agent, or Firm* — Gilliam IP PLLC

(57) ABSTRACT

In some embodiments, a magnetometer mounting apparatus and system may reduce noise and magnetic flux interference by mounting the magnetometer inside a cavity in a collar that fits around a tool insert. The cavity may be sealed with a hatch cover/outsert. Another embodiment mounts a plurality of magnetometers around the periphery of a mounting ring that is coupled to the insert. Yet another embodiment mounts the magnetometers in a gap sub in the BHA. Still
(Continued)

another embodiment longitudinally mounts the magnetometers on the insert such that a diagonal distance between two magnetometers is the greatest possible on the insert.

20 Claims, 9 Drawing Sheets

(51) Int. Cl.
    *G01V 3/26* (2006.01)
    *E21B 1/00* (2006.01)
    *E21B 10/00* (2006.01)
    *E21B 15/00* (2006.01)
    *H04L 1/00* (2006.01)

(52) U.S. Cl.
    CPC ........... *E21B 15/00* (2013.01); *G01R 1/00* (2013.01); *G01V 2200/00* (2013.01); *H04L 1/00* (2013.01)

(56) References Cited

U.S. PATENT DOCUMENTS

| | | | | |
|---|---|---|---|---|
| 2010/0108380 A1* | 5/2010 | Teodorescu | ............. | E21B 10/00 175/24 |
| 2011/0127999 A1* | 6/2011 | Lott | ................ | G01R 33/04 324/239 |
| 2011/0147083 A1* | 6/2011 | Mauldin | ................ | E21B 44/00 175/50 |
| 2012/0067644 A1* | 3/2012 | Goswami | .......... | E21B 47/02216 175/45 |
| 2012/0199400 A1 | 8/2012 | Boulet et al. | | |
| 2013/0314092 A1* | 11/2013 | Shumway | ................ | G01V 3/40 324/346 |
| 2014/0076633 A1 | 3/2014 | Terracina et al. | | |
| 2014/0174825 A1 | 6/2014 | Chau et al. | | |
| 2014/0262513 A1* | 9/2014 | Chau | .................... | E21B 47/011 175/40 |
| 2015/0090494 A1* | 4/2015 | Lazarev | ................ | E21B 47/122 175/40 |

OTHER PUBLICATIONS

"International Application Serial No. PCT/US2015/028495, Written Opinion dated Aug. 20, 2015", 9 pgs.

Canadian Application Serial No. 2,954,349; Canadian Office Action; dated Mar. 29, 2018, 4 pages.

"InternationApplication Serial No. PCT/US2015/028495, International Preliminary Report on Patentability dated Feb. 23, 2017", 11 pages.

GCC Application Serial No. 2015/29637; Second Examination report; dated Jul. 15, 2018, 5 pages.

* cited by examiner

MAGNETOMETER MOUNTING FOR ISOLATION AND INTERFERENCE REDUCTION

CLAIM OF PRIORITY

This application claims the benefit of U.S. Provisional Application Ser. No. 62/035,009, filed on Aug. 8, 2014 which application is incorporated by reference herein in its entirety.

BACKGROUND

Understanding the structure and properties of geological formations can reduce the cost of drilling wells for oil and gas exploration. Measurements are typically made in a borehole (i.e., down hole measurements) to attain this understanding, such as to identify the composition and distribution of material that surrounds the measurement device down hole. To obtain such measurements, magnetometers are sometimes implemented to provide telemetry, ranging, and drill bit location functions.

Due to their extreme sensitivity, magnetometers typically need a low noise environment in which to operate. Electrical noise and magnetic flux interference with the magnetometers may thus introduce errors in various measurements.

DETAILED DESCRIPTION

To address some of the challenges described above, as well as others, various embodiments of mounting magnetometers to an insert/collar are illustrated. These embodiments may reduce electrical and magnetic interference with a magnetometer to reduce problems with gradient and distance measurement errors downhole.

Figure 1:
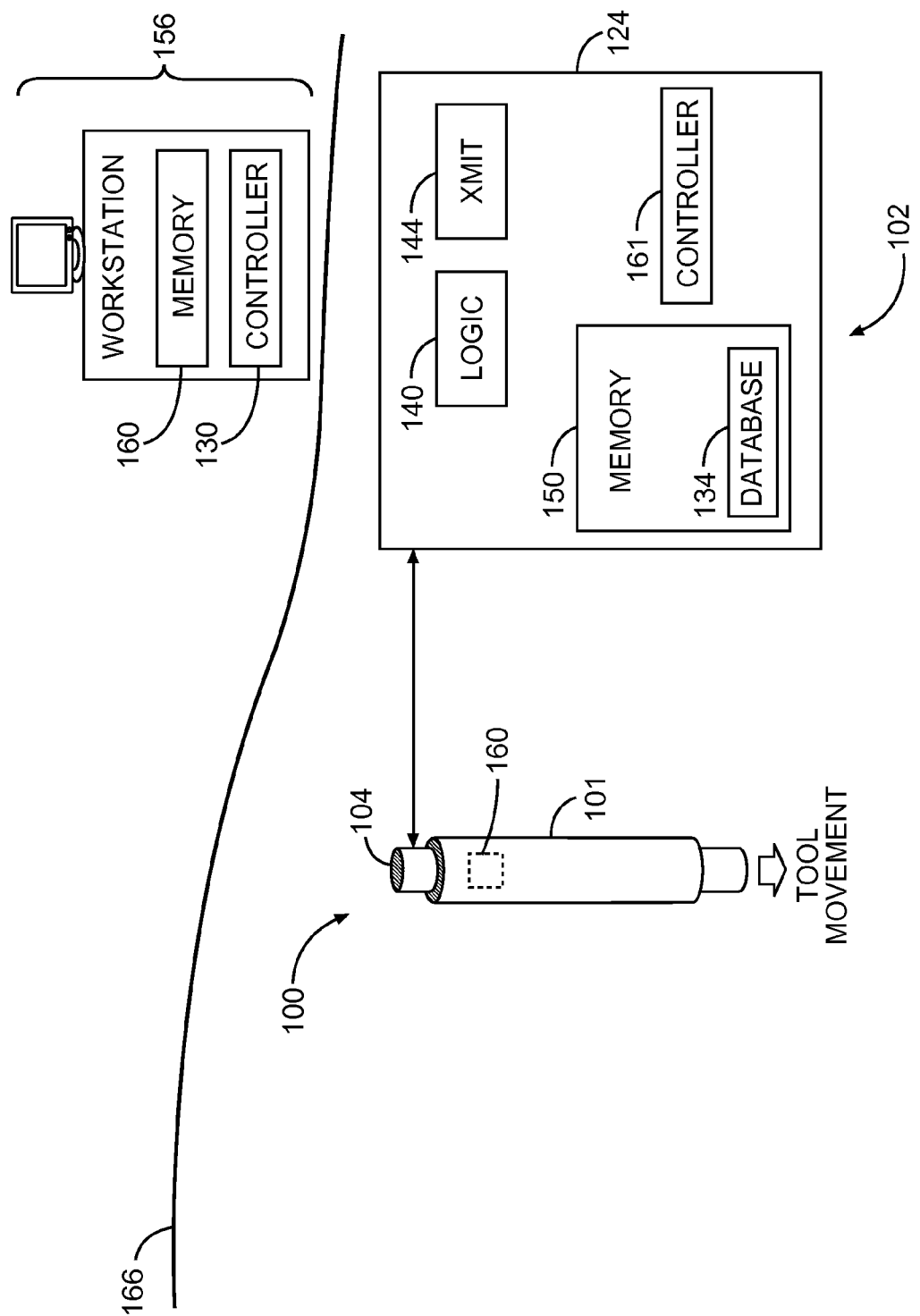
FIG. 1 is a block diagram showing a tool apparatus and system, according to various embodiments.

FIG. 1 is a block diagram showing a tool apparatus 100 and system 102, according to various embodiments. The tool apparatus 100 includes a tool housing 101 that may include a tool insert 104 as described in subsequent embodiments. The housing 104 may take the form of a wireline tool body or a downhole drill string tool.

Downhole applications of the apparatus 100 shown in FIG. 1 include reception of EM telemetry downlink signals, reception of signals in EM telemetry repeaters, reception of signals used for ranging to magnetic objects or to objects carrying low frequency electric currents, mineralogy, and analysis of mud magnetic susceptibility. For example, in the case of ranging applications, an oscillating magnetic field can be induced in a target well that is to be located. The oscillating magnetic field can be achieved with a rotating magnet on a drill bit or using an electromagnetic source, such as a transmitter. Alternating current can also be impressed on the casing of a target well, or the source of a time-varying magnetic field can be placed in the target well. The magnetic fields from these activities may then be measured by the magnetometers that are mounted to the insert 104.

The system of FIG. 1 may further include a surface 166, a workstation 156 located at or near the surface 166 (not downhole), and a data acquisition system 124. The surface workstation 156 may include a controller 130 and memory 160. The data acquisition system 124 may be located within the tool housing 101 and electrically coupled to one or more magnetometers 160. The data acquisition system 124 may include a data transmitter 144 (e.g., a telemetry transmitter) to transmit acquired data values to the surface workstation 156 over a wireless or wireline channel. Logic 140 may be used to acquire and process signals received from the apparatus 100. Received data can be stored in the memory 150, which in some implementations may be as part of a database 134. A controller 161 may be used to control operation of the data acquisition system 124.

Figure 2:
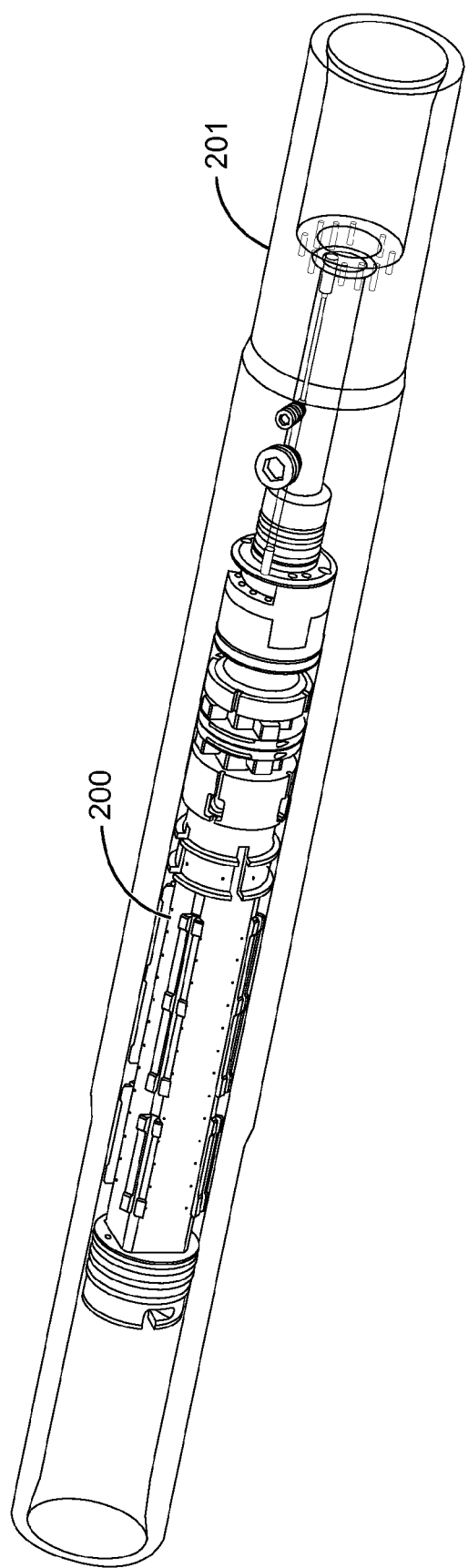
FIG. 2 is a perspective view showing a tool insert and collar apparatus that includes magnetometers, according to various embodiments.

FIG. 2 is a perspective view showing a tool insert and collar apparatus that includes magnetometers, according to various embodiments. The insert 200 may be inserted into a collar 201 that is part of the tool housing 101 of FIG. 1 or the collar 201 and the tool housing 101 may be the same thing. The insert 200 and collar 201 apparatus may be part of a drill string or wireline tool.

Figure 3:
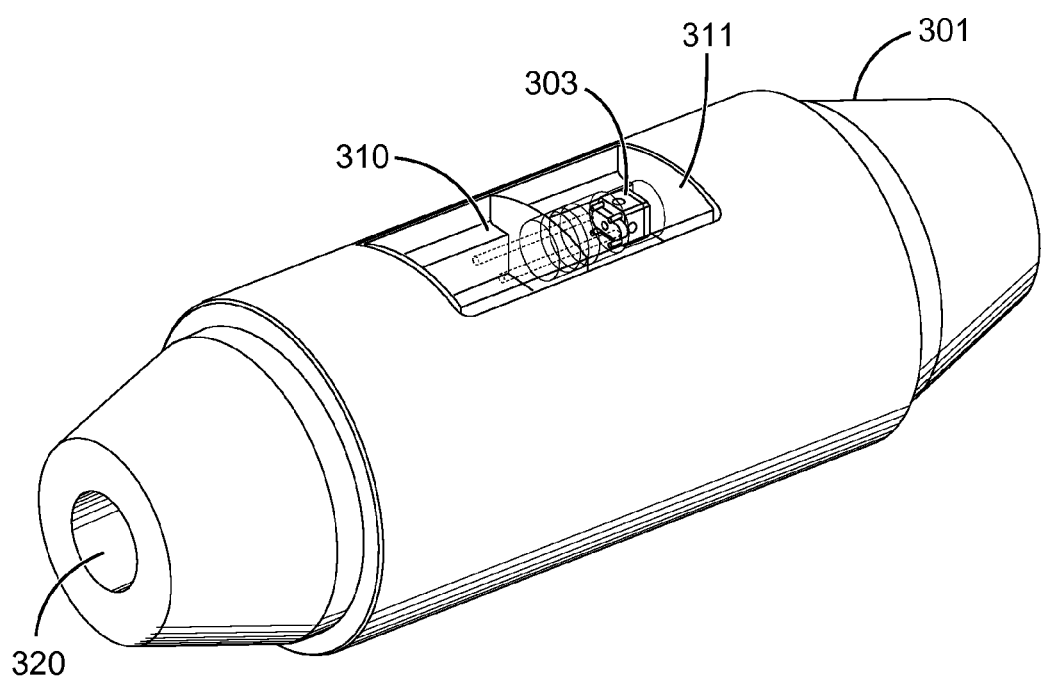
FIG. 3 is a perspective view showing a magnetometer mounted in a cavity of a collar, according to various embodiments.

FIG. 3 is a perspective view of a collar 301 showing a magnetometer 303 mounted in a cavity of the collar 301, according to various embodiments. The collar 301 includes a magnetometer 303 and its associated electronics mounted in a housing 311. The housing 311 is then mounted inside a cavity 310 of the collar 301.

As in the embodiment of FIG. 3, the collar 301 may include an opening 320 extending longitudinally through the collar 301 that fits around an insert. An insert may be coupled to one or more collars 301, each having a magnetometer 303 located in a cavity 310. The one or more collars 301 may then be mounted on the insert.

Figure 4:
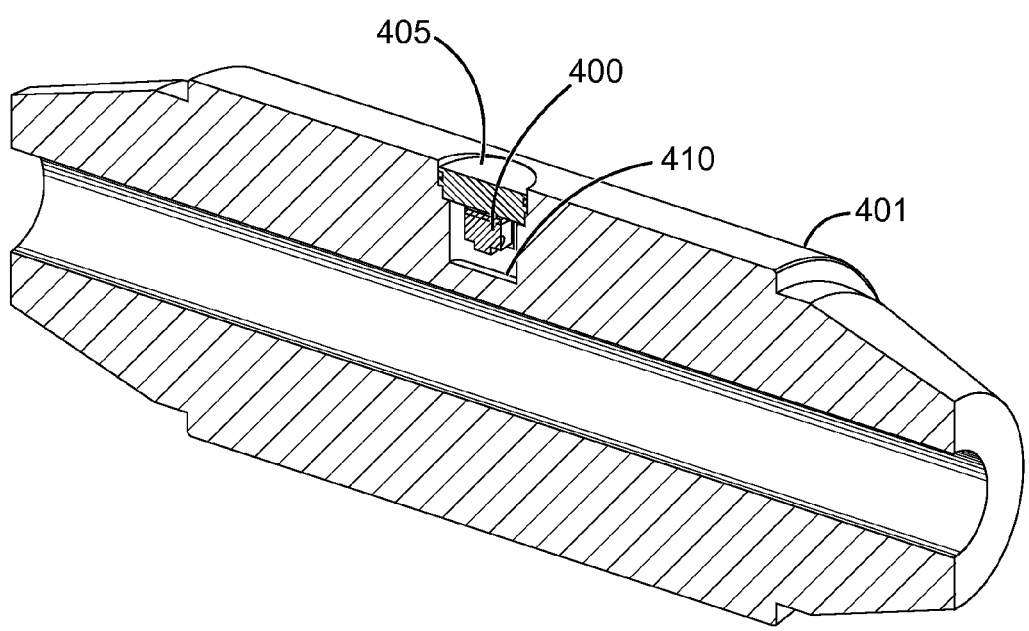
FIG. 4 is a cross-sectional view showing a collar having a cavity within the collar with a hatch cover, according to various embodiments.

FIG. 4 is a cross-sectional view showing a collar having a cavity 410 within the collar 401 with a hatch cover 405, according to various embodiments. The embodiment illustrated in FIG. 4 is similar to that of FIG. 3 except the embodiment of FIG. 4 does not include the housing 311 to hold the magnetometer and its associated electronics. The magnetometer 400 and associated electronics are mounted in the cavity 410 that is then sealed with a hatch cover 405 to prevent mud and other fluids from entering the cavity 410. The hatch cover 405 may include a gasket to help seal the cavity 410.

Figure 5:
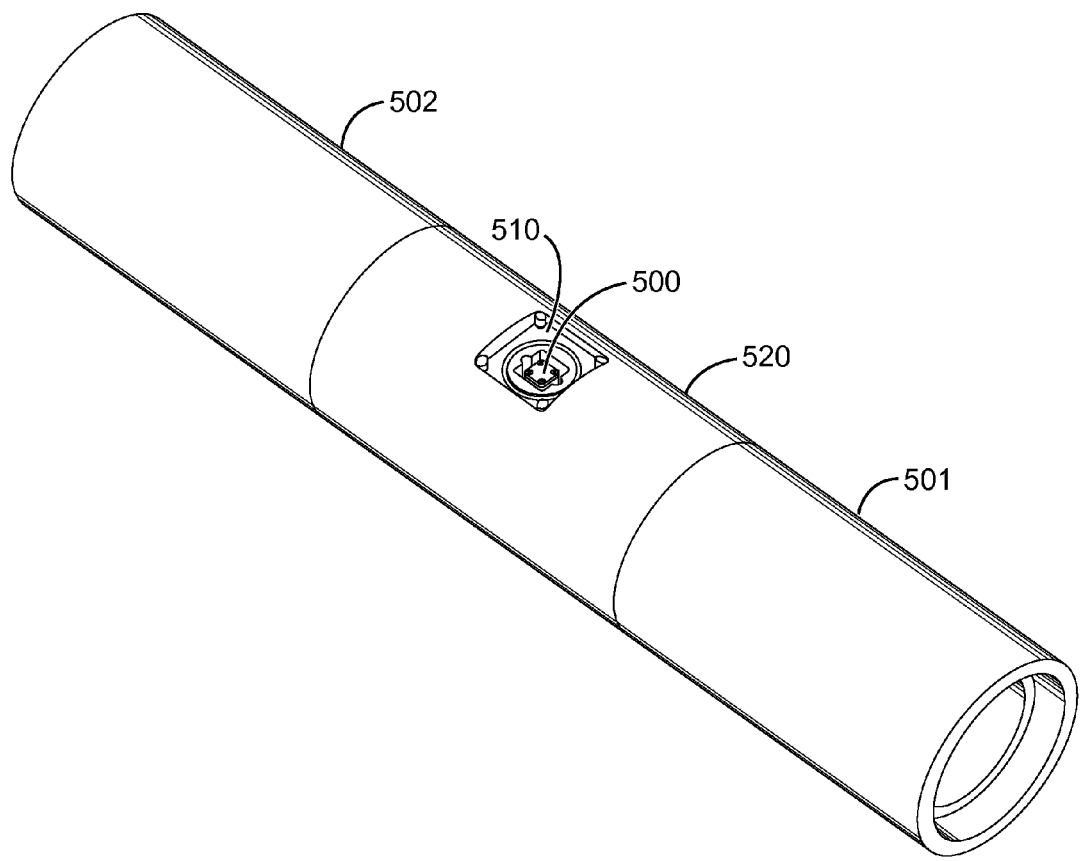
FIG. 5 is a perspective view showing a gap sub of a collar including a cavity to house a magnetometer, according to various embodiments.

FIG. 5 is a perspective view showing a gap sub 520 of a collar 501, 502 including a cavity 510 to house a magnetometer 500, according to various embodiments. A gap sub provides electrical isolation in a drill string that may be carrying electrical current.

The gap sub 520 is shown coupled between two sections 501, 502 of the collar to provide the electrical isolation between those two collar sections 501, 502. The gap sub 520 may comprise various insulating materials such as fiberglass or ceramic.

Figure 6:
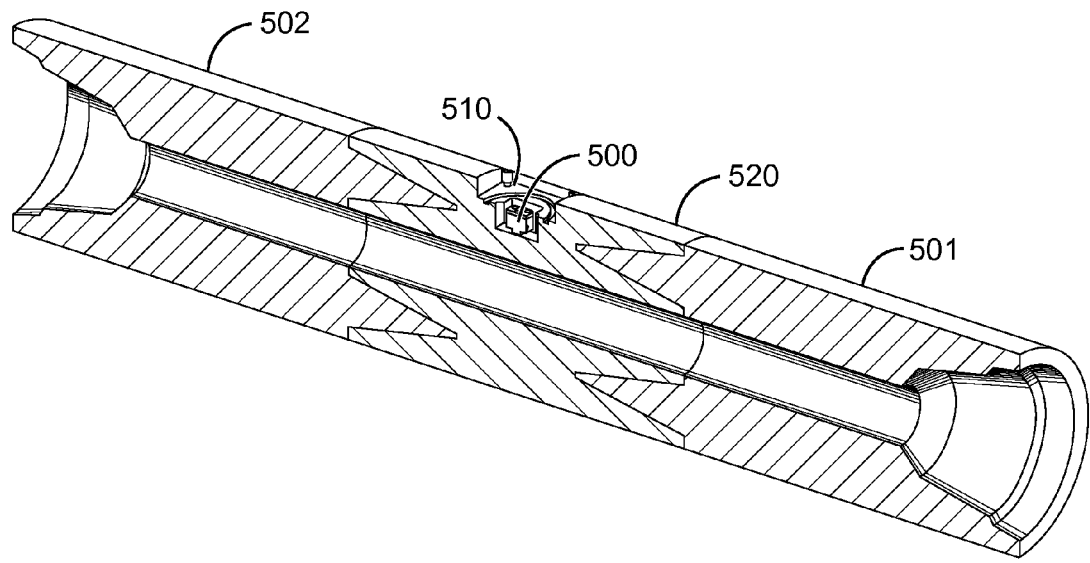
FIG. 6 is a cross-sectional view showing the gap sub, according to the embodiment of FIG. 5.

FIG. 6 is a cross-sectional view showing the gap sub, according to the embodiment of FIG. 5. This view shows the cavity 510 within the gap sub 520. The magnetometer 500 is then located within the cavity 510. A cover (not shown for clarity), substantially similar to the hatch cover of the embodiment of FIG. 4, can be used to seal the cavity 510 to keep out mud and other fluids. The cover may include a gasket to help seal the cavity 510.

Figure 7:
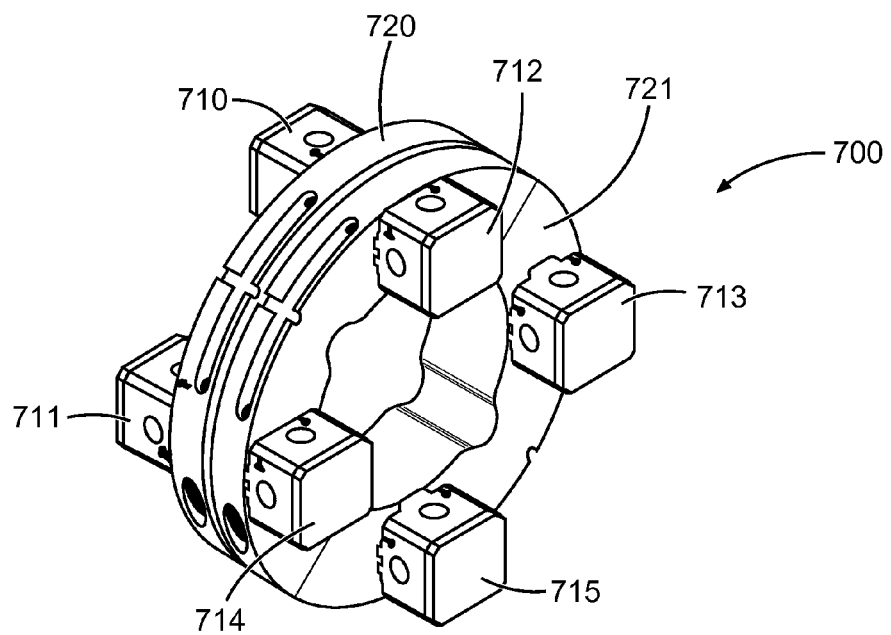
FIG. 7 is a perspective view showing a mounting ring for an insert including magnetometers mounted externally around the periphery of the mounting ring, according to various embodiments.
Figure 8:
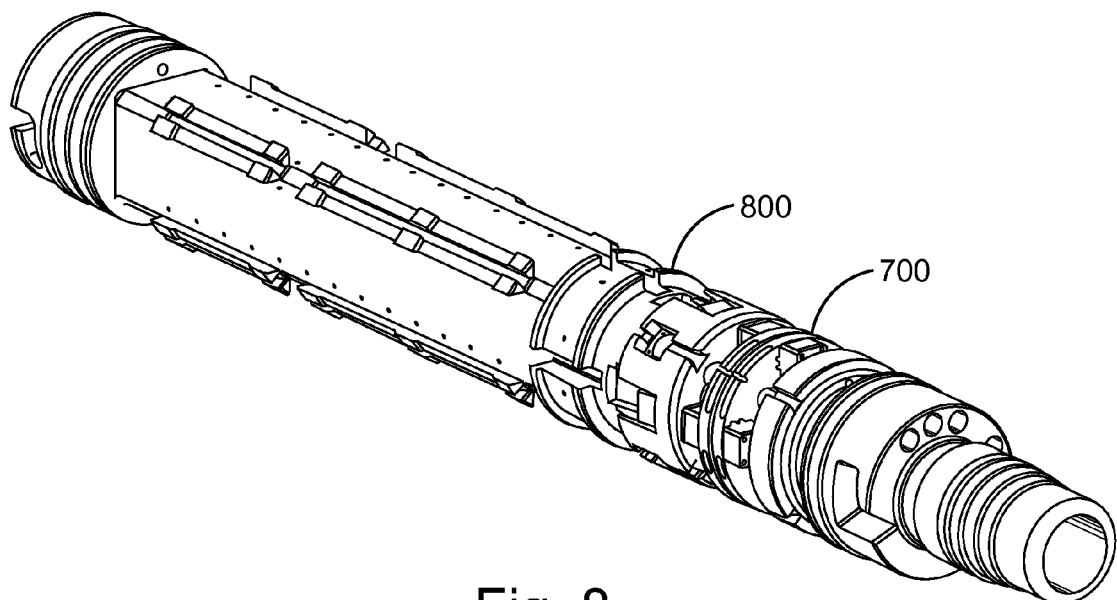
FIG. 8 is a perspective view showing an insert comprising the mounting ring, according to the embodiment of FIG. 7.

FIG. 7 is a perspective view showing a mounting ring 700 for an insert including magnetometers 710-715 mounted externally around the periphery of the mounting ring 700, according to various embodiments. The mounting ring 700 with the magnetometers 710-715 may then be coupled to an insert 800, as illustrated in FIG. 8, where the hole in the mounting ring corresponds with the axial hole running longitudinally in the insert 800. FIG. 8 is a perspective view showing an insert 800 comprising the mounting ring 700, according to the embodiment of FIG. 7.

In an embodiment, the mounting ring 700 may include two sections 720, 721 each having one or more magnetometers 710-715 coupled thereto. The mounting ring sections 720, 721 may be a dielectric material (e.g., fiberglass, ceramic) or coated with a dielectric material.

Figure 9:
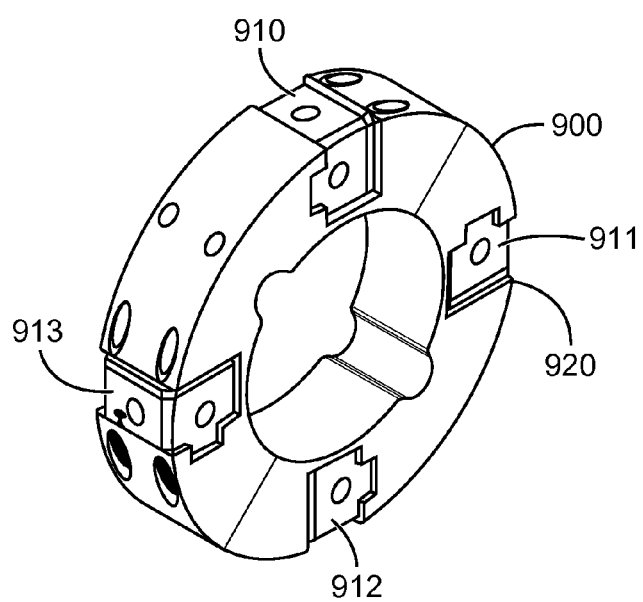
FIG. 9 is a perspective view showing a mounting ring for an insert including magnetometers mounted internally around the periphery of the mounting ring, according to various embodiments.

FIG. 9 is a perspective view of a mounting ring 900 for an insert including magnetometers 910-913 mounted internally around the periphery of the mounting ring 900, according to various embodiments. The mounting ring 900 may then be coupled to an insert in a substantially similar manner as that shown in FIG. 8. The mounting ring 900 of FIG. 9 may comprise a dielectric material (e.g., fiberglass, ceramic) or coated with a dielectric material.

Since the mounting ring 900 is mounted in an insert, a gap 920 separates the outer edges of each of the magnetometers 910-913 and the outer edge of the mounting ring 900. This reduces the chance of the magnetometers 910-913 coming into contact with the metal insert/collar.

Figure 10:
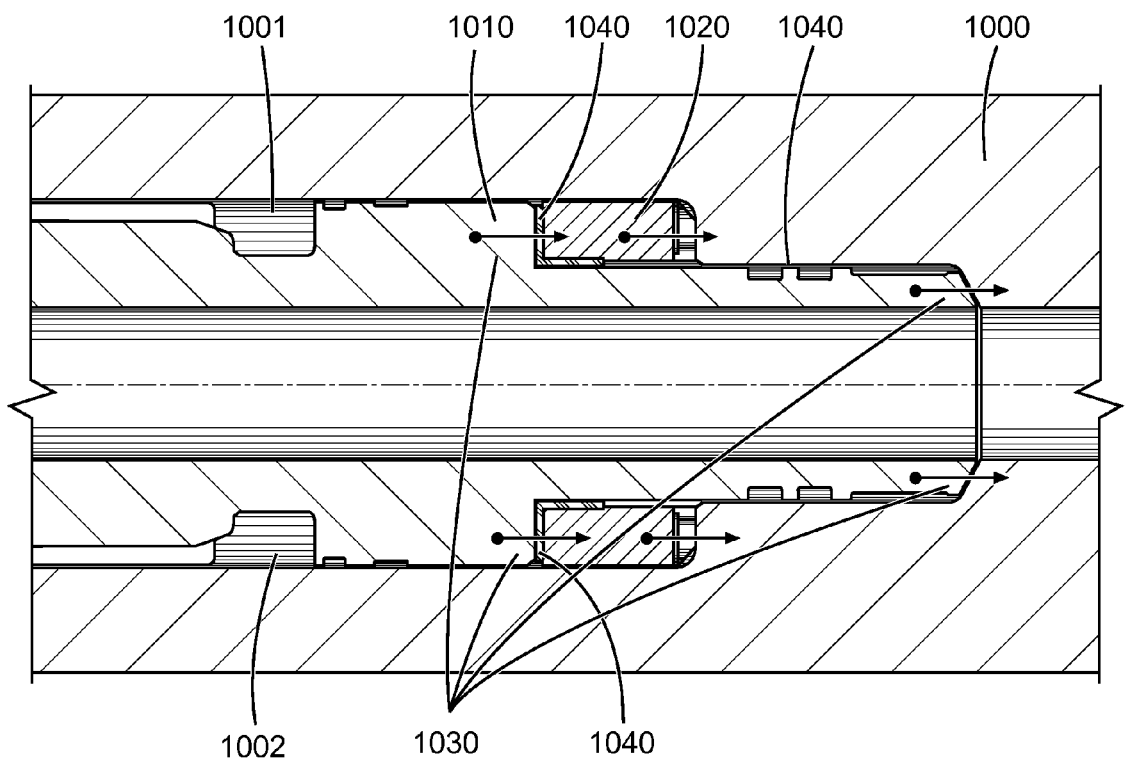
FIG. 10 is a cross-sectional diagram showing a non-conductive coating between an insert and a collar, according to various embodiments.

FIG. 10 is a cross-sectional diagram showing a non-conductive coating between an insert and a collar, according to various embodiments. The embodiment of FIG. 10 shows a collar 1000 with an insert 1010 coupled therein. A connector ring 1020 includes connectors and wires that the insert 1010 plugs into in order for the insert 1010 to be electrically connected to the collar 1000.

Two magnetometer mounting locations 1001, 1002 are shown on the insert 1010. Since the insert 1010 is comprised of metal, it is desirable to electrically isolate the insert 1010 from the collar 1000. The embodiment of FIG. 10 uses a non-conductive coating/sleeve 1040 between the insert 1010 and the connector ring 1020 and the collar 1000. The non-conductive coating or sleeve 1040 may reduce current leakage 1030 from the insert to the connector ring to the collar and, thus, reduce any noise that may interfere with magnetic field measurements performed by the magnetometers.

The non-conductive coating/sleeve 1040 may be any insulating coating such as Teflon®, polyether etherketone (PEEK), an insulating material such as Peek, ceramic, or fiberglass. It is desirable that the coating/sleeve be able to withstand high temperatures and high pressures in the downhole environment. The coating can be applied using electrophoretic deposition using either continuous direct current (CDC) or pulsed direct current (PDC) deposition. Further the coating can be applied by anodizing or plasma coating.

While some of the above-described embodiments may show only one magnetometer, one skilled in the art would realize that a drill string or downhole tool housing may include multiple magnetometers for proper measurements to be accomplished.

Figure 11:
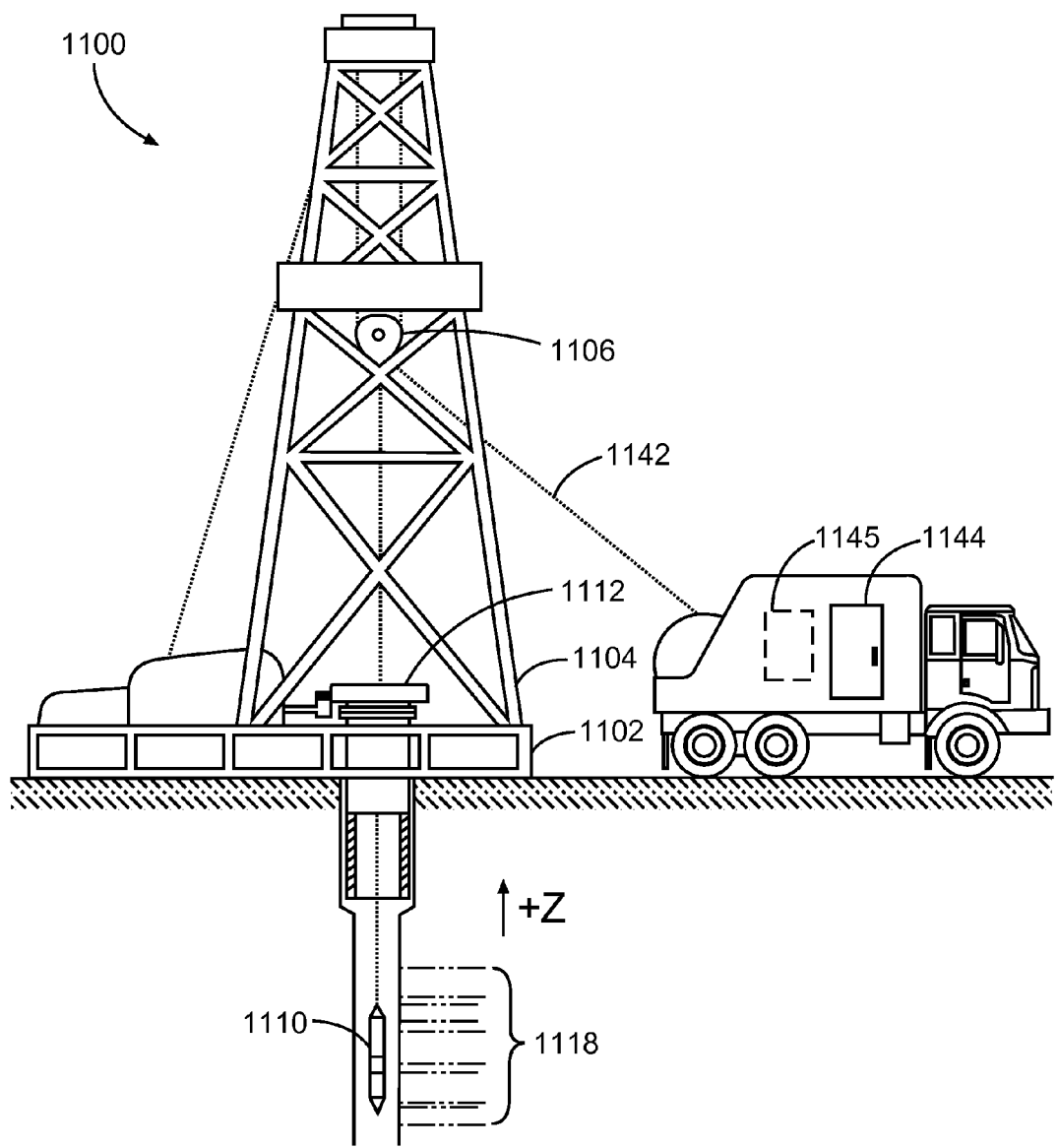
FIG. 11 is a diagram showing a wireline system, according to various embodiments.

FIG. 11 is a diagram showing a wireline system 1100, according to various embodiments. The system of FIG. 11 may include any of the embodiments of magnetometer mounting discussed previously. Similar to the example of FIG. 12, a hoist 1106 may be included as a portion of a platform 1102, such as coupled to a derrick 1104, and used to raise or lower equipment such as a wireline tool 1110 (e.g., sonde, probe) into or out of a borehole. The wireline sonde 1110 may include any of the above-described embodiments.

In this wireline example, a cable 1142 (e.g., slickline) may provide a communicative coupling between a logging facility 1144 (e.g., including a processor circuit 1145 including memory or other storage or control circuitry) and the sonde 1110. In this manner, information about the geological formation 1118 (e.g., reservoir) may be obtained. The processor circuit 1145 can be configured to execute instructions for the locally lumped EOS fluid characterization method and perform the reservoir simulation based on the locally lumped EOS fluid characterizations.

Figure 12:
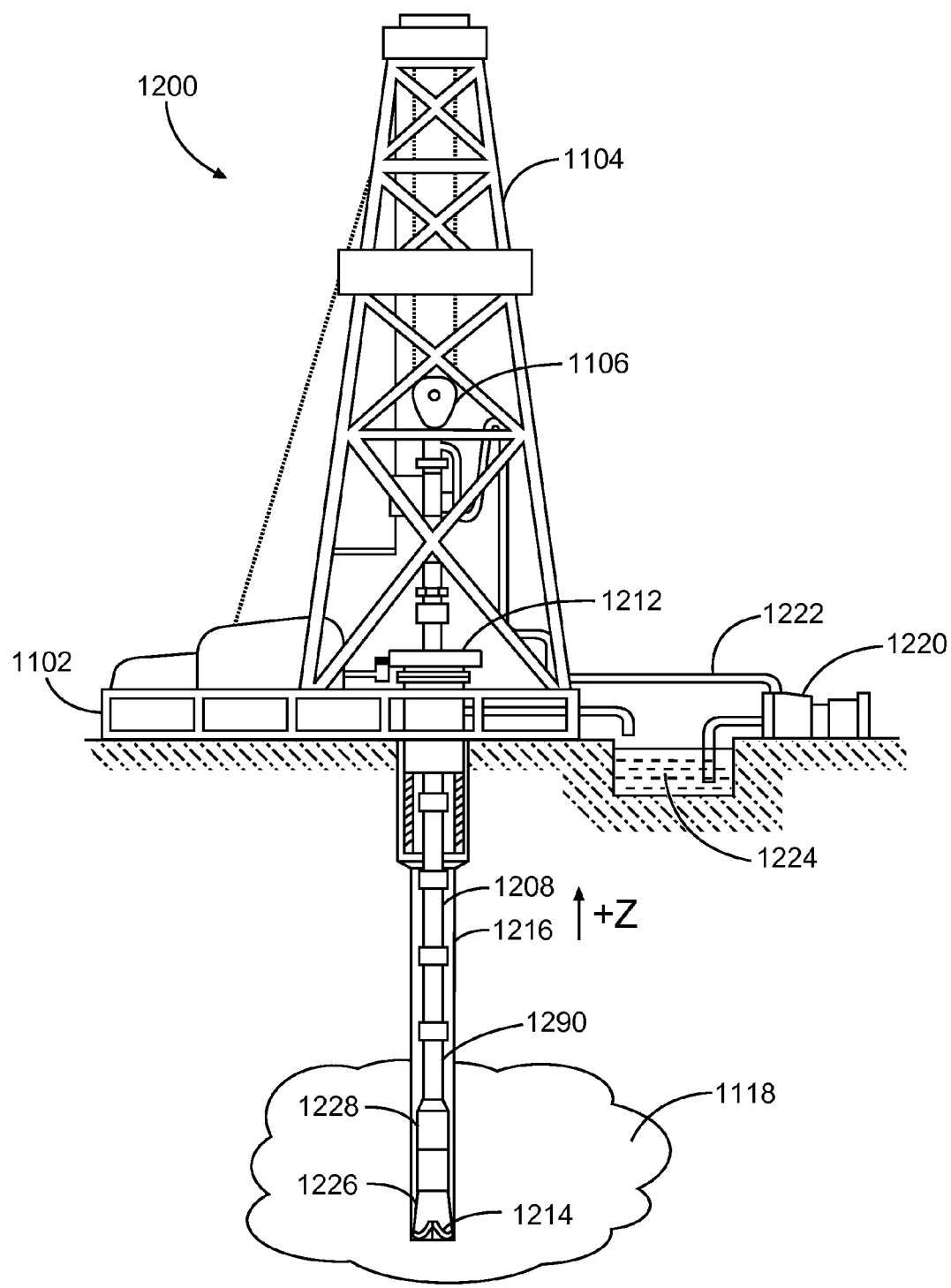
FIG. 12 is a diagram showing a drilling rig system, according to various embodiments.

FIG. 12 is a diagram showing a drilling rig system 1200, according to various embodiments, The system 1200 may include a measuring while drilling (MWD) or logging while drilling (LWD) capability. The drilling apparatus can use data from an insert in the drill string 1208, having magnetometers mounted as discussed previously, to steer the drill bit 1214.

A drilling rig or platform 1102 generally includes a derrick 1104 or other supporting structure, such as including or coupled to a hoist 1106. The hoist 1106 may be used for raising or lowering equipment or other apparatus such as drill string 1208. The drill string 1208 may access a borehole 1216, such as through a well head 1212. The lower end of the drill string 1208 may include various apparatus, such as a drill bit 1214, to produce the borehole 1216.

A drilling fluid or "mud" may be circulated in the annular region around the drill bit 1214 or elsewhere, such as provided to the borehole 1216 through a supply pipe 1222, circulated by a pump 1220, and returning to the surface to be captured in a retention pit 1224 or sump. Various subs or tool assemblies may be located along the drill string 1208, such as include a bottom hole assembly (BHA) 1226 or a second sub 1228.

Example 1 is a magnetometer mounting apparatus, comprising:
a tool insert; a magnetometer; and a collar configured to couple around the tool insert, the collar comprising a cavity in which the magnetometer is mounted.

In Example 2, the subject matter of Example 1 can further include a housing to hold the magnetometer within the cavity.

In Example 3, the subject matter of Examples 1-2 can further include magnetometer associated electronics coupled in the housing.

In Example 4, the subject matter of Examples 1-3 can further include a hatch cover coupled over the magnetometer in the cavity.

In Example 5, the subject matter of Examples 1-4 can further include wherein the hatch cover further comprises a gasket configured to seal the cavity in combination with the hatch cover.

In Example 6, the subject matter of Examples 1-5 can further include a plurality of collars coupled around the tool insert, each collar including a magnetometer.

Example 7 is a magnetometer mounting apparatus, comprising: a collar comprising a plurality of sections; a gap sub coupled between the plurality of collar sections; and a magnetometer mounted in the gap sub.

In Example 8, the subject matter of Example 7 can further include wherein the gap sub comprises a dielectric material.

In Example 9, the subject matter of Examples 7-8 can further include wherein the dielectric material comprises fiberglass or ceramic.

In Example 10, the subject matter of Examples 7-9 can further include wherein the gap sub further comprises a cavity in which the magnetometer is mounted.

In Example 11, the subject matter of Examples 7-10 can further include a cover configured to seal the cavity.

Example 12 is a magnetometer mounting apparatus, comprising: a tool insert; a mounting ring coupled to the tool insert; and a plurality of magnetometers coupled to the mounting ring, the plurality of magnetometer coupled around the periphery of the mounting ring.

In Example 13, the subject matter of Example 12 can further include wherein the plurality of magnetometers are coupled externally around the periphery of the mounting ring.

In Example 14, the subject matter of Examples 12-13 can further include wherein the plurality of magnetometers are coupled internally around the periphery of the mounting ring.

In Example 15, the subject matter of Examples 12-14 can further include wherein the mounting ring comprises a dielectric material.

In Example 16, the subject matter of Examples 12-15 can further include wherein a hole in the mounting ring corresponds to an axial hole running longitudinally through the insert.

Example 17 is a magnetometer mounting apparatus, comprising: a tool insert; a plurality of magnetometers mounted radially on the tool insert; and connector ring configured to electrically couple the tool insert to a collar wherein a non-conductive coating or sleeve separates the insert from the connector ring and the connector ring from the collar.

Example 18 is a system comprising: a downhole tool housing; at least one collar mounted inside the downhole tool housing, the collar comprising a cavity; a tool insert mounted inside the collar; and a magnetometer mounted inside the cavity.

In Example 19, the subject matter of Example 18 can further include wherein the downhole tool housing is part of a drillstring.

In Example 20, the subject matter of Examples 18-19 can further include wherein the downhole tool housing is part of a wireline system.

The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Although specific embodiments have been illustrated and described herein, it will be appreciated by those of ordinary skill in the art that any arrangement that is calculated to achieve the same purpose may be substituted for the specific embodiments shown. Various embodiments use permutations or combinations of embodiments described herein. It is to be understood that the above description is intended to be illustrative, and not restrictive, and that the phraseology or terminology employed herein is for the purpose of description. Combinations of the above embodiments and other embodiments will be apparent to those of ordinary skill in the art upon studying the above description.

What is claimed is:

1. A magnetometer mounting apparatus, comprising:
    a tool insert;
    a magnetometer;
    a collar configured to couple around the tool insert, the collar comprising a cavity in which the magnetometer is mounted, wherein the magnetometer is electrically isolated from other collar sections; and
    a hatch cover coupled over the magnetometer in the cavity, wherein the hatch cover is positioned on an exterior surface of the collar and spans a portion of a circumference of the collar.

2. The magnetometer mounting apparatus of claim 1, further comprising a housing to hold the magnetometer within the cavity.

3. The magnetometer mounting apparatus of claim 2, further comprising magnetometer associated electronics coupled in the housing.

4. The magnetometer mounting apparatus of claim 1, wherein the hatch cover further comprises a gasket configured to seal the cavity in combination with the hatch cover.

5. The magnetometer mounting apparatus of claim 1, further comprising a plurality of collars coupled around the tool insert, each collar including a magnetometer.

6. A magnetometer mounting apparatus, comprising:
    a collar comprising a plurality of sections;
    a gap sub coupled between the plurality of sections;
    a magnetometer mounted in the gap sub, wherein the gap sub is electrically isolated from the plurality of sections; and
    a cover configured to seal the cavity in which the magnetometer is mounted, wherein the cover is positioned on an exterior surface of the gap sub and spans a portion of a circumference of the gap sub.

7. The magnetometer mounting apparatus of claim 6, wherein the gap sub comprises a dielectric material.

8. The magnetometer mounting apparatus of claim 7, wherein the dielectric material comprises fiberglass or ceramic.

9. The magnetometer mounting apparatus of claim 6, wherein the gap sub further comprises a cavity in which the magnetometer is mounted.

10. A magnetometer mounting apparatus, comprising:
a tool insert;
a mounting ring coupled to the tool insert; and
a plurality of magnetometers coupled to the mounting ring, the plurality of magnetometer coupled around the periphery of the mounting ring;
a collar of a drill string configured around the tool insert and mounting ring.

11. The magnetometer mounting apparatus of claim 10, wherein the plurality of magnetometers are coupled externally around the periphery of the mounting ring.

12. The magnetometer mounting apparatus of claim 11, wherein outer edges of the plurality of magnetometers are physically separate from an outer edge of the mounting ring.

13. The magnetometer mounting apparatus of claim 10, wherein the plurality of magnetometers are coupled internally around the periphery of the mounting ring.

14. The magnetometer mounting apparatus of claim 13, wherein outer edges of the plurality of magnetometers are physically separate from an outer edge of the mounting ring.

15. The magnetometer mounting apparatus of claim 10, wherein the mounting ring comprises a dielectric material.

16. The magnetometer mounting apparatus of claim 10, wherein a hole in the mounting ring corresponds to an axial hole running longitudinally through the insert.

17. A magnetometer mounting apparatus, comprising:
a tool insert;
a plurality of magnetometers mounted radially on the tool insert; and
connector ring configured to electrically couple the tool insert to a collar wherein a non-conductive coating or sleeve separates the insert from the connector ring and the connector ring from the collar.

18. A system comprising:
a downhole tool housing;
at least one collar mounted inside the downhole tool housing, the collar comprising a cavity;
a tool insert mounted inside the collar;
a magnetometer mounted inside the cavity, wherein the magnetometer is electrically isolated from other collars; and
a hatch cover coupled over the magnetometer in the cavity, wherein the hatch cover is positioned on an exterior surface of the at least one collar and spans a portion of a circumference of the at least one collar.

19. The system of claim 18, wherein the downhole tool housing is part of a drillstring.

20. The system of claim 18, wherein the downhole tool housing is part of a wireline system.

* * * * *